(12) United States Patent
Yamada et al.

(10) Patent No.: US 9,739,300 B2
(45) Date of Patent: Aug. 22, 2017

(54) COMPONENT CRIMPING APPARATUS

(71) Applicant: Panasonic Intellectual Property Management Co., Ltd., Osaka (JP)

(72) Inventors: Akira Yamada, Yamanashi (JP); Shinjiro Tsuji, Yamanashi (JP); Satoshi Adachi, Yamanashi (JP); Yasutaka Tsuboi, Yamanashi (JP); Toshihiko Tsujikawa, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 246 days.

(21) Appl. No.: 14/804,463

(22) Filed: Jul. 21, 2015

(65) Prior Publication Data
US 2016/0052196 A1 Feb. 25, 2016

(30) Foreign Application Priority Data

Aug. 20, 2014 (JP) ................................. 2014-167101

(51) Int. Cl.
*H05K 3/32* (2006.01)
*F16B 11/00* (2006.01)
(Continued)

(52) U.S. Cl.
CPC ............ *F16B 11/006* (2013.01); *H05K 3/321* (2013.01); *H05K 3/323* (2013.01); *G02F 1/1303* (2013.01);
(Continued)

(58) Field of Classification Search
CPC .................. F16B 11/006; H05K 3/321; H01L 2021/6003; H01L 2021/60277; H01L 2021/60112; H01L 2021/60
See application file for complete search history.

(56) References Cited

U.S. PATENT DOCUMENTS 5,439,161 A * 8/1995 Kawatani .......... H01L 21/67138
228/180.21
5,847,796 A * 12/1998 Uchiyama ........... G02F 1/13452
349/149
(Continued)

FOREIGN PATENT DOCUMENTS

JP            9-69543 A     3/1997
JP        2011066189 A  *  3/2011

*Primary Examiner* — Robert B Davis
(74) *Attorney, Agent, or Firm* — Pearne & Gordon, LLP (57) ABSTRACT

A component crimping apparatus includes: a substrate holding part that holds a substrate of a transparent material, a component previously attached to each electrode of electrodes juxtaposed in an edge of the substrate through a photo-curable adhesive member; a supporting part having a base part with an optical path and a transparent member on the base part and connected to the optical path, and supports, by the transparent member, a region under a targeted electrode in the substrate; a crimping tool arranged over the transparent member and presses the component to the substrate; a light irradiating part that irradiates the adhesive member attached to the targeted electrode with light through the optical path; and a light shielding member that covers a portion in which the transparent member is not installed in an opening part of the optical path in the base part.

3 Claims, 11 Drawing Sheets

(51) Int. Cl.
*G02F 1/13* (2006.01)
*G02F 1/1345* (2006.01)

(52) U.S. Cl.
CPC .. *G02F 1/13452* (2013.01); *H05K 2203/0195* (2013.01)

(56) References Cited

U.S. PATENT DOCUMENTS

| | | | | |
|---|---|---|---|---|
| 7,144,471 | B2* | 12/2006 | Kobayashi | B29C 43/36 156/272.2 |
| 7,938,929 | B2* | 5/2011 | Minamitani | H01L 21/563 156/299 |
| 8,366,864 | B2* | 2/2013 | Morimoto | H01L 21/67092 156/297 |
| 2010/0243153 | A1* | 9/2010 | Onitsuka | H01L 24/79 156/290 |
| 2015/0082621 | A1* | 3/2015 | Yamada | G02F 1/1303 29/740 |
| 2015/0096687 | A1* | 4/2015 | Tsuboi | H05K 13/08 156/378 |

* cited by examiner

COMPONENT CRIMPING APPARATUS

CROSS-REFERENCES TO RELATED APPLICATION(S)

This application is based on and claims priority from Japanese Patent Application No. 2014-167101 filed on Aug. 20, 2014, the entire contents of which are incorporated herein by reference.

BACKGROUND

1. Field of the Invention

One or more embodiments of the present invention relate to a component crimping apparatus for bonding a component to each of plural electrodes juxtaposed in an edge of a substrate through an adhesive member.

2. Description of Related Art

A component crimping apparatus is an apparatus for bonding components to plural electrodes formed in an edge of a substrate through adhesive members, and includes a supporting part for supporting a region under the electrode in a region of a lower surface of the substrate, and crimping tools arranged over the supporting part. When the crimping tools press the components on the substrate supported by the supporting part, the components are bonded to the substrate by bonding force of the adhesive members. When the number of components to be crimped to the substrate is larger than the number of crimping tools, all the components can be crimped to the substrate by performing plural crimping operations, each operation for a part of the plural electrodes, while shifting positions of the electrodes with respect to the crimping tools.

On the other hand, some component crimping apparatuses use a photo-curable adhesive member (see, for instance, Patent Reference 1 described below). In this type of component crimping apparatus, a supporting part supports a lower region under an electrode by a transparent member. Then, when crimping tools press components to a substrate, a light irradiating part irradiates the adhesive member with light from the lower surface side of the substrate through the transparent member. Since this irradiation photocures the adhesive member, the component can be bonded at a temperature lower than normal. Also in the component crimping apparatus using such a photo-curable adhesive member, when the number of components to be crimped to the substrate is larger than the number of crimping tools, all the components can be crimped to the substrate by performing plural crimping operations, each operation for some of the plural electrodes, while shifting positions of the electrodes with respect to the crimping tools.

Patent Reference 1 is JP-A-9-69543.

SUMMARY

However, in the case of attempting to crimp the components by the plural crimping operations as described above in the component crimping apparatus using the photo-curable adhesive member, light is also applied to an adhesive member of an electrode which is not yet targeted for crimping the component and a region under the electrode in a region of the lower surface of the substrate is not received by the transparent member. Because of this, the adhesive member may be photocured before crimping the component, and component crimping failure may occur.

Hence, an object of the embodiments of the invention is to provide a component crimping apparatus capable of preventing crimping failure from occurring due to previous photocuring of an adhesive member through which a component is not targeted for crimping.

According to an embodiment of the invention, there is provided a component crimping apparatus including: a substrate holding part that holds a substrate of a transparent material, a component previously attached to each electrode of a plurality of electrodes juxtaposed in an edge of the substrate through a photo-curable adhesive member; at least one supporting part that has a base part provided with an optical path opened in an upper surface, and a transparent member installed on the upper surface of the base part and connected to the optical path, and supports, by the transparent member, a region under a targeted electrode in a lower surface of the substrate held by the substrate holding part, the targeted electrode being an electrode targeted for crimping the component among the plurality of electrodes; at least one crimping tool that is arranged over the transparent member and presses the component to the substrate whose lower surface is supported by the supporting part; a light irradiating part that irradiates the adhesive member attached to the targeted electrode with light from a lower surface side of the substrate through the transparent member by irradiating the optical path with the light when the crimping tool presses the component to the substrate; and a light shielding member that covers a portion in which the transparent member is not installed in an opening part of the optical path in the upper surface of the base part.

One of embodiments of the invention can prevent crimping failure from occurring due to previous photocuring of an adhesive member through which a component is not targeted for crimping.

DETAILED DESCRIPTION

Figure 1:
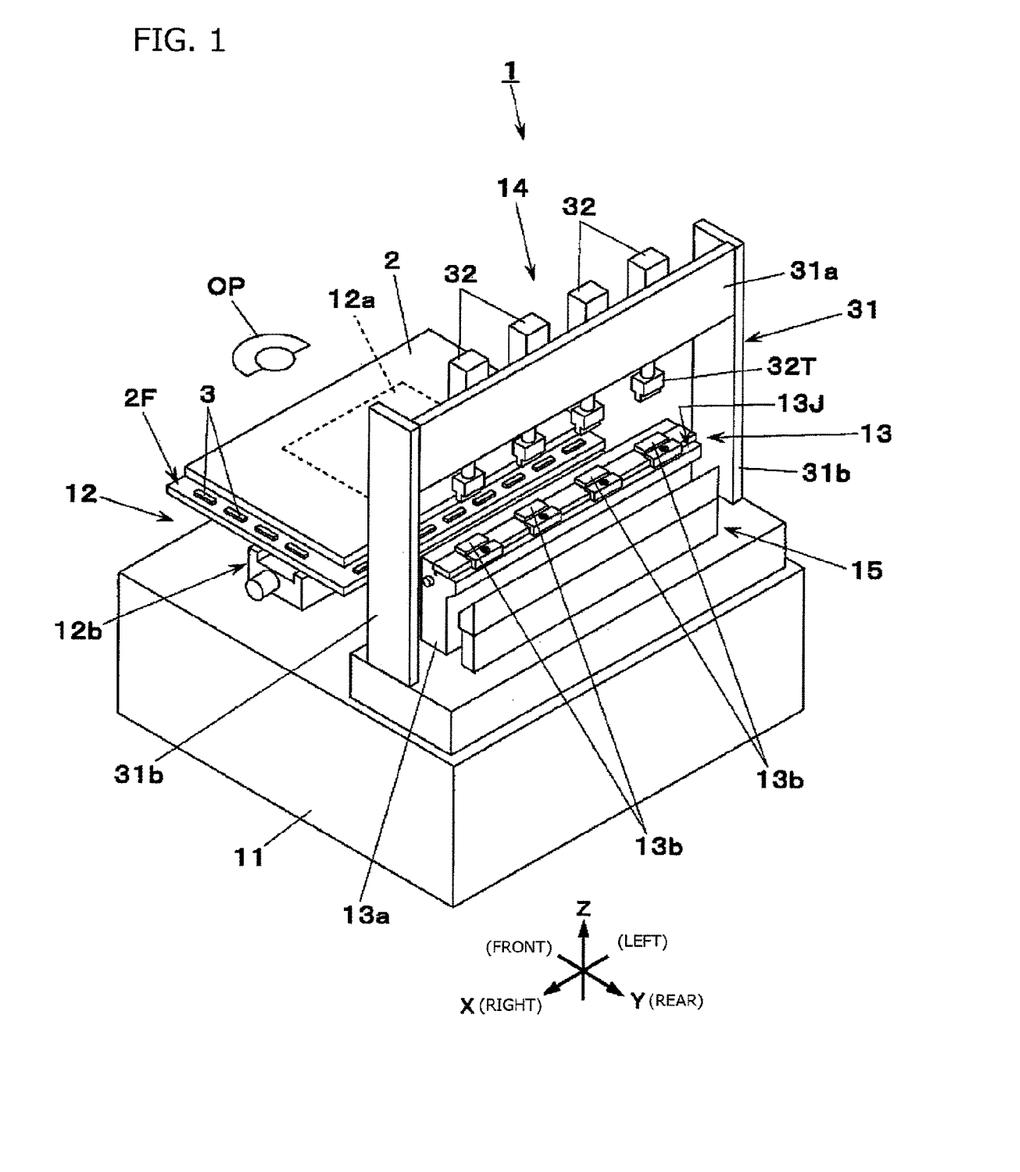
FIG. 1 is a perspective view of a component crimping apparatus in an embodiment of the invention.
Figure 2:
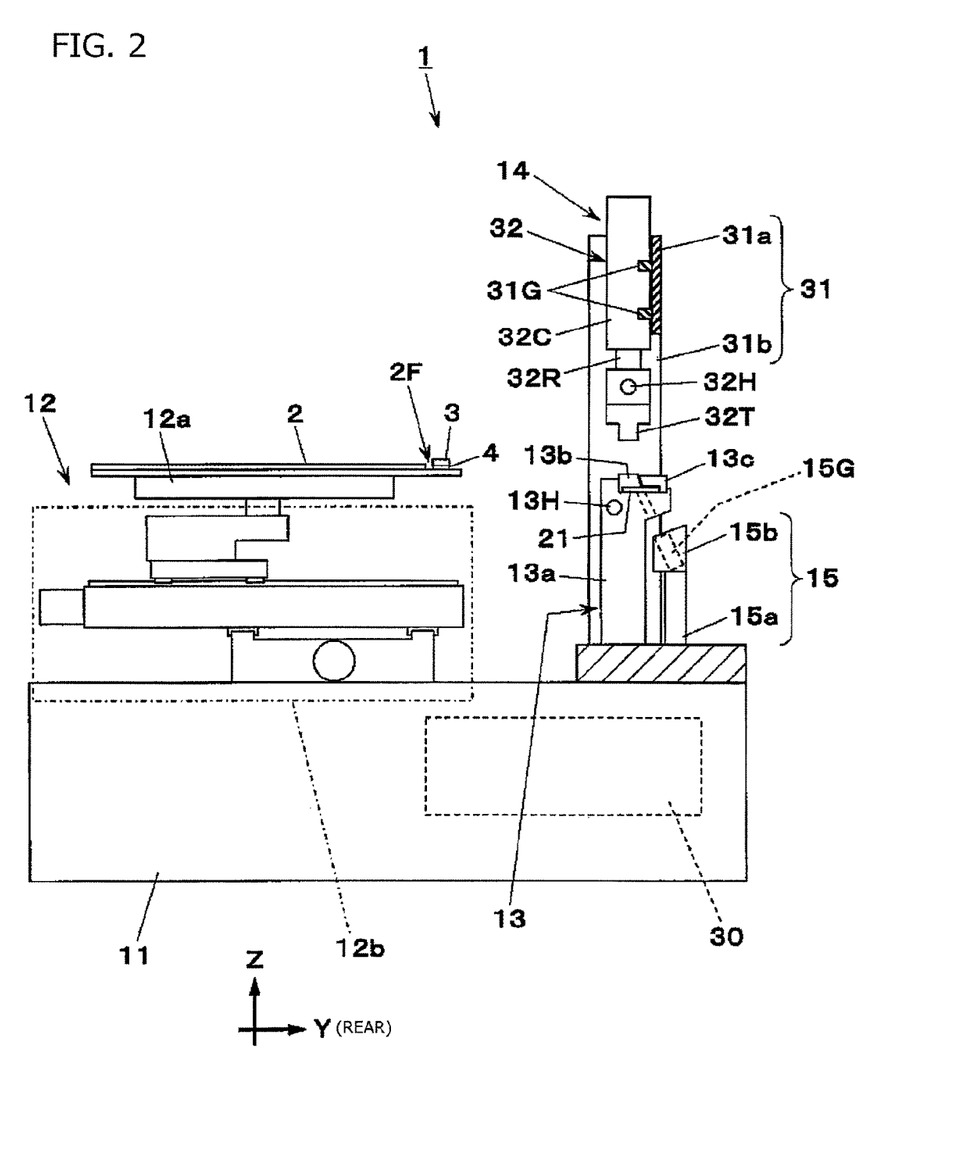
FIG. 2 is a side view of the component crimping apparatus in the embodiment of the invention.
Figure 3:
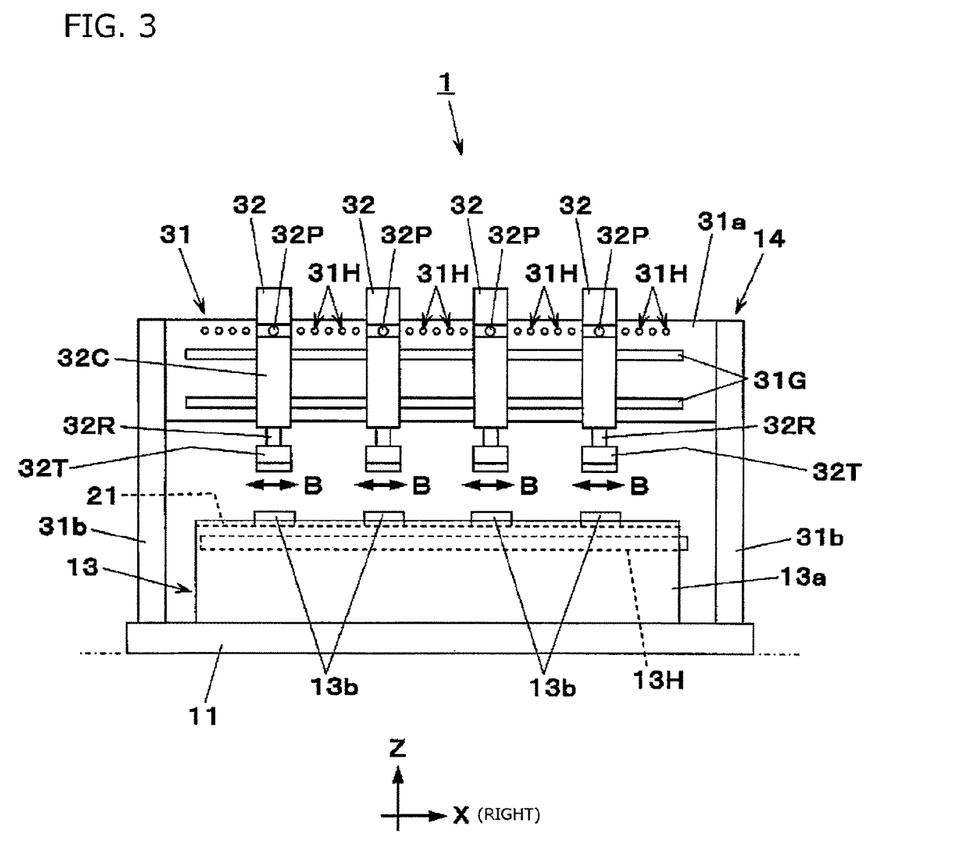
FIG. 3 is a partially front view of the component crimping apparatus in the embodiment of the invention.

An embodiment of the invention will hereinafter be described with reference to the drawings. FIGS. 1 to 3 show a component crimping apparatus 1 in the embodiment of the invention. The component crimping apparatus 1 is an apparatus that crimps plural components 3 previously attached (temporarily fixed) to an edge 2F of a substrate 2. The case where the component crimping apparatus 1 is used as a main crimping apparatus in a liquid crystal panel manufacturing system will herein be described by way of example.

Figure 4:
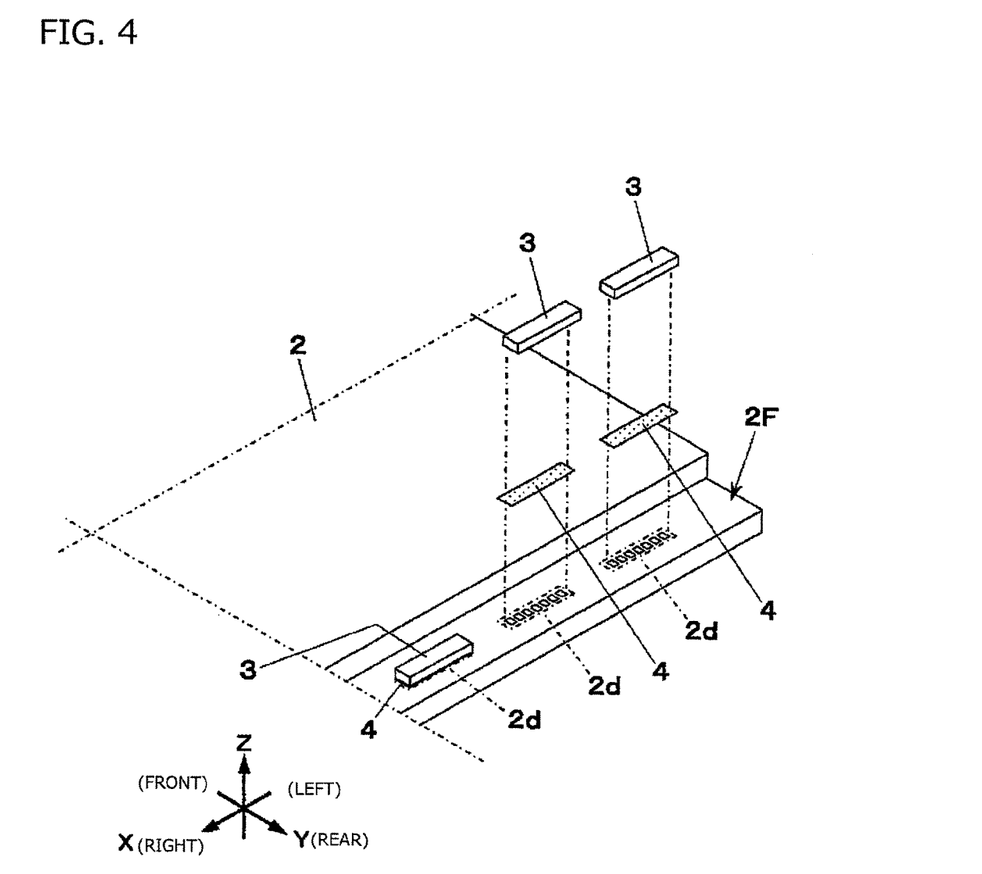
FIG. 4 is a partially exploded perspective view of a substrate which the component crimping apparatus in the embodiment of the invention targets for work.

The substrate 2 is made of a transparent material such as glass, and has a generally rectangular shape. Plural electrodes 2d are juxtaposed in each of the two orthogonal edges 2F in four sides included by the substrate 2 (FIG. 4). The component 3 such as an integrated circuit (driver IC) for driving is attached to each of the electrodes 2d through a tape-shaped photo-curable adhesive member 4 to be cured with irradiation with light such as ultraviolet rays. In the present embodiment, the eight components 3 are attached to one edge 2F (long side) of the substrate 2 at equal intervals, and the four components 3 are attached to the other edge 2F (short side) of the substrate 2 at equal intervals. The photo-curable adhesive member 4 is an adhesive that exerts bonding force at a temperature lower than normal by being photocured with the irradiation with light.

In FIGS. 1 to 3, the component crimping apparatus 1 includes a substrate holding movement part 12, a supporting part 13, a crimping part 14 and a light irradiating part 15 on a base 11. The substrate holding movement part 12 has a table-shaped substrate holding part 12a for holding a lower surface of the substrate 2 by vacuum suction etc., and a holding part movement mechanism 12b for moving the substrate holding part 12a. The holding part movement mechanism 12b freely moves the substrate holding part 12a in a left-right direction (X-axis direction), a front-rear direction (Y-axis direction) and a vertical direction (Z-axis direction) viewed from an operator OP.

In FIGS. 1 and 2, the supporting part 13 is formed in a rear region of the substrate holding movement part 12. The supporting part 13 has a base part 13a formed on the base 11 so as to extend in the X-axis direction, and plural (four herein) transparent members 13b formed on an upper surface 13J (also see FIG. 5) of the base part 13a.

In FIGS. 5A and 5B, FIGS. 6A and 6B and FIGS. 7A and 7B, an optical path 13T obliquely extending from the rear toward the front upper side is thoroughly formed in an upper part of the base part 13a. An opening part (upper opening 13Ka) of the optical path 13T in the upper surface 13J of the base part 13a has a length of substantially the whole region of the upper surface 13J of the base part 13a in a width direction (X-axis direction), and an opening part (lower opening 13Kb) of the lower side of the optical path 13T also has the same width as that of the upper opening 13Ka.

Each of the transparent members 13b is a block-shaped member made of a transparent material such as glass. Each of the transparent members 13b is formed so as to cover a part of the optical path 13T in the upper surface 13J of the base part 13a. Each of the transparent members 13b is slidable (arrows A shown in FIG. 5A) along a slide groove 13M (FIG. 5A) (that is, in a horizontal direction with respect to the base part 13a) formed in the upper surface 13J of the base part 13a in the X-axis direction, and can be positioned in any position in the X-axis direction. An upper region of the base part 13a is provided with a lower heater 13H for uniformly heating the four transparent members 13b by heat generation operation.

Figure 5A:
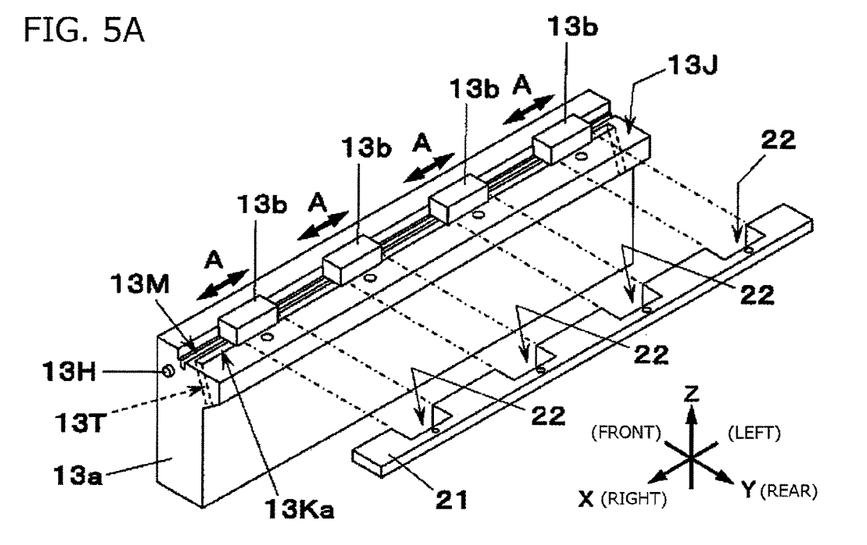
FIGS. 5A and 5B are perspective views of a supporting part included by the component crimping apparatus in the embodiment of the invention.
Figure 5B:
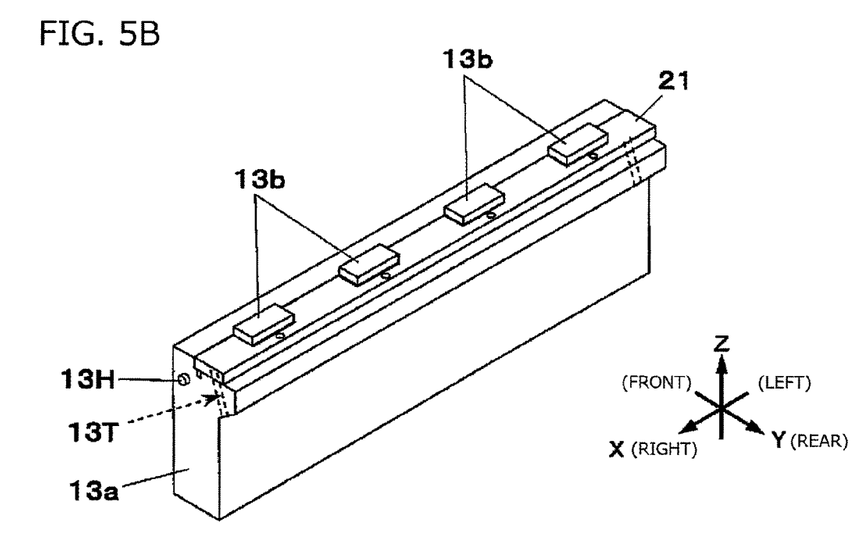

In FIGS. 5A and 5B, a light shielding member 21 is attached to the upper surface 13J of the base part 13a. The light shielding member 21 is made of a long plate member extending along the upper surface 13J of the base part 13a in the X-axis direction, and has rectangular notches 22 with substantially the same shape as that of the transparent member 13b in plan view by the same number (four herein) as the number of transparent members 13b. When the light shielding member 21 is attached to the base part 13a so as to receive the transparent members 13b in these notches 22 (FIG. 5A→FIG. 5B), portions in which the four transparent members 13b are not installed in the opening part (upper opening 13Ka) of the optical path 13T in the upper surface 13J of the base part 13a become covered with the light shielding member 21.

When the light shielding member 21 is attached to the upper surface 13J of the base part 13a, the operator OP slides the transparent members 13b along the slide groove 13M (arrows A shown in FIG. 5A) so that arrangement pitches (distances between the adjacent transparent members 13b) of the four transparent members 13b become equal to arrangement pitches of the four notches 22 of the light shielding member 21. Since the arrangement pitches of the transparent members 13b depend on the arrangement pitches of the notches 22 of the light shielding member 21, the light shielding member 21 functions as a positioning member of each of the transparent members 13b. Plural kinds of light shielding members 21 with different shapes (arrangement pitches of the notches 22) according to arrangement pitches of the components 3 of the substrate 2 targeted for work are previously prepared, and the operator OP selects and uses the light shielding member 21 according to the arrangement pitch of the transparent members 13b when the arrangement pitch of the transparent members 13b is adjusted according to the arrangement pitch of the components 3 targeted for crimping. In addition, the arrangement pitches of the notches 22 of the light shielding member 21 can be set at pitches which are multiples of the arrangement pitch of the components 3.

Figure 6A:
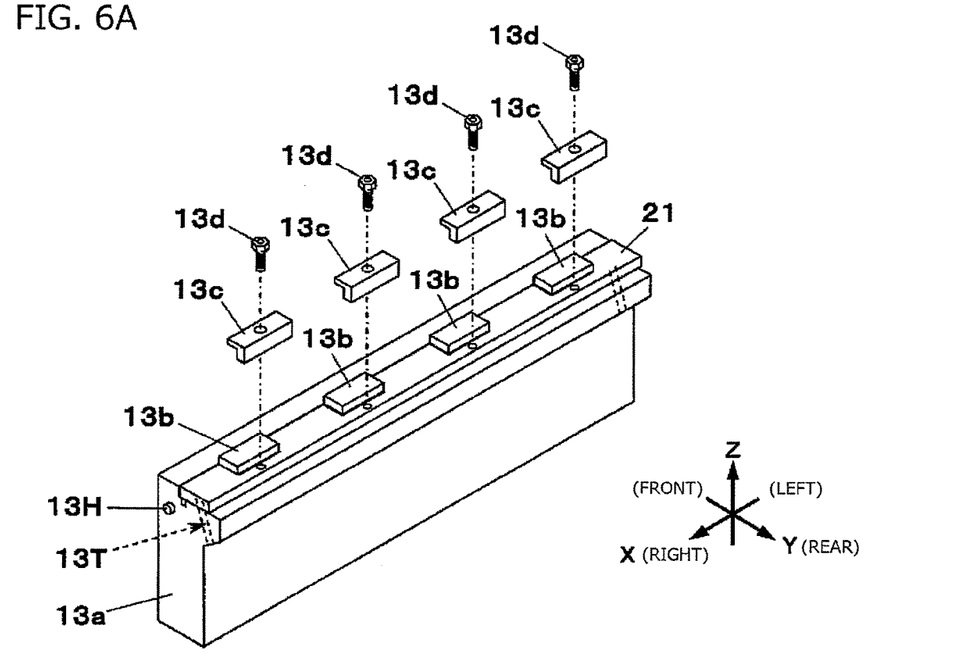
FIGS. 6A and 6B are perspective views of the supporting part included by the component crimping apparatus in the embodiment of the invention.
Figure 6B:
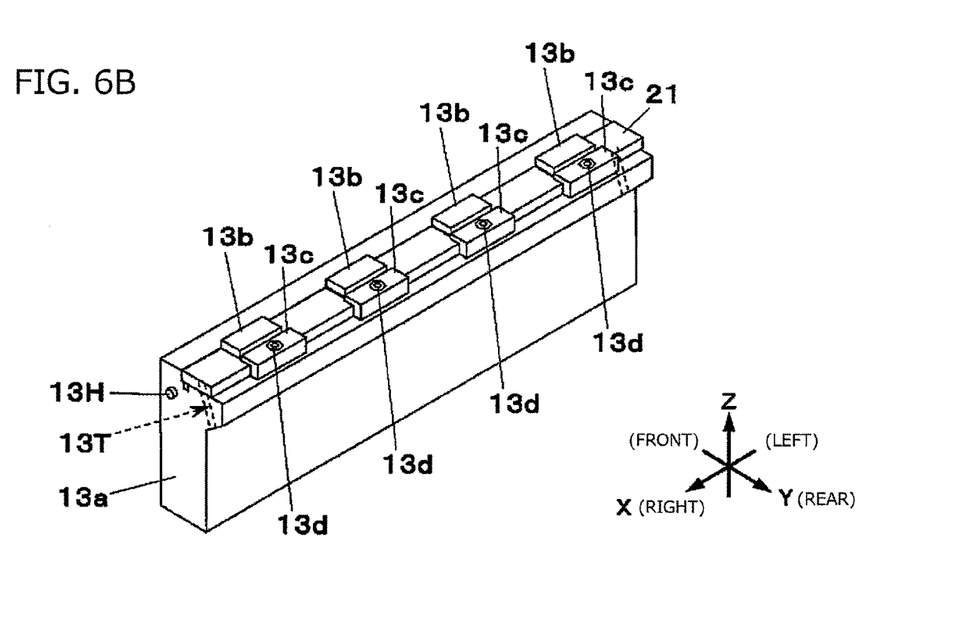

After the light shielding member 21 is attached to the base part 13a as described above, the operator OP fixes the light shielding member 21 to the base part 13a. As shown in FIG. 6A herein, plural (four herein) block parts 13c are respectively attached to the upper surface 13J of the base part 13a by fixation screws 13d, and the light shielding member 21 is pinched between the plural block parts 13c and the upper surface 13J of the base part 13a and thereby, the light shielding member 21 is fixed to the base part 13a (FIG. 6B).

In FIGS. 1 to 3, the crimping part 14 includes a portal frame 31 formed on the base 11, and plural (four, namely, the same number as the number of transparent members 13b herein) crimping cylinders 32 attached to the portal frame 31. The portal frame 31 includes a lateral bridge part 31a extending over the supporting part 13 in the X-axis direction, and two struts 31b for supporting both ends of the lateral bridge part 31a. The front of the lateral bridge part 31a is provided with a pair of upper and lower guides 31G extending in the X-axis direction.

In FIGS. 2 and 3, in each of the crimping cylinders 32, a cylinder tube 32C is attached to the pair of upper and lower guides 31G in a posture in which a piston rod 32R faces downwardly. A crimping tool 32T is attached to the lower end of the piston rod 32R of each of the crimping cylinders 32. And, each of the crimping cylinders 32 is constructed so that the cylinder tube 32C can be slid along the guides 31G in the X-axis direction (arrows B shown in FIG. 3) and the four crimping tools 32T can be moved in a direction of arrangement of the crimping tools 32T. An upper heater 32H is built into the crimping tool 32T of each of the crimping cylinders 32, and the crimping tool 32T is heated by heat generation operation. The crimping tools 32T are located over a line of the four transparent members 13b included by the supporting part 13.

In FIG. 3, the front of the lateral bridge part 31a is provided with plural positioning holes 31H arranged in the X-axis direction. In a state in which one hole selected from these plural positioning holes 31H is matched with one hole (not shown) formed in the cylinder tube 32C of the crimping cylinder 32 in the front-rear direction, a pin 32P is inserted from the front side of the lateral bridge part 31a and thereby, the crimping cylinder 32 can be fixed to the lateral bridge part 31a. The four crimping cylinders 32 are positioned and fixed to the lateral bridge part 31a so that an arrangement pitch of the crimping tools 32T matches with the pitch (arrangement pitch of the transparent members 13b) according to the arrangement pitch of the components 3 and the four crimping cylinders 32 are located over the four transparent members 13b. That is, each of the crimping tools 32T is arranged over each of the transparent members 13b. This arrangement pitch of the crimping tools 32T may be adjusted so that the same member as the light shielding member 21 attached to the supporting part 13 is attached to the lateral bridge part 31a and the crimping tools 32T are positioned using positions of the notches 22 of the light shielding member 21 as a guideline.

In FIGS. 1 and 2, the light irradiating part 15 is formed in a rear region of the supporting part 13. The light irradiating part 15 includes an irradiating part base 15a formed on the base 11 so as to extend in the X-axis direction, and an irradiating part body 15b formed on an upper part of the irradiating part base 15a. The irradiating part body 15b includes a light source 15G for emitting light 15L such as ultraviolet rays.

Figure 7A:
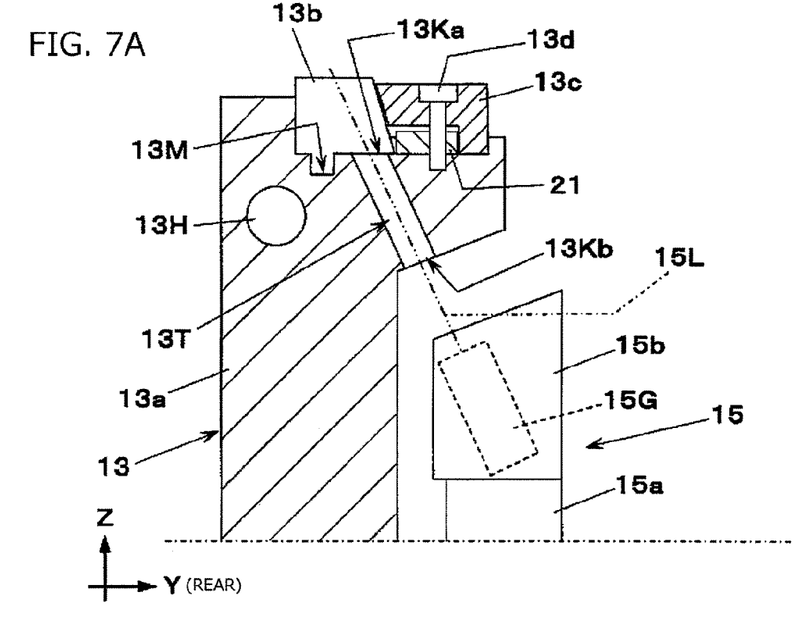
FIGS. 7A and 7B are partially enlarged side views of the component crimping apparatus in the embodiment of the invention.
Figure 7B:
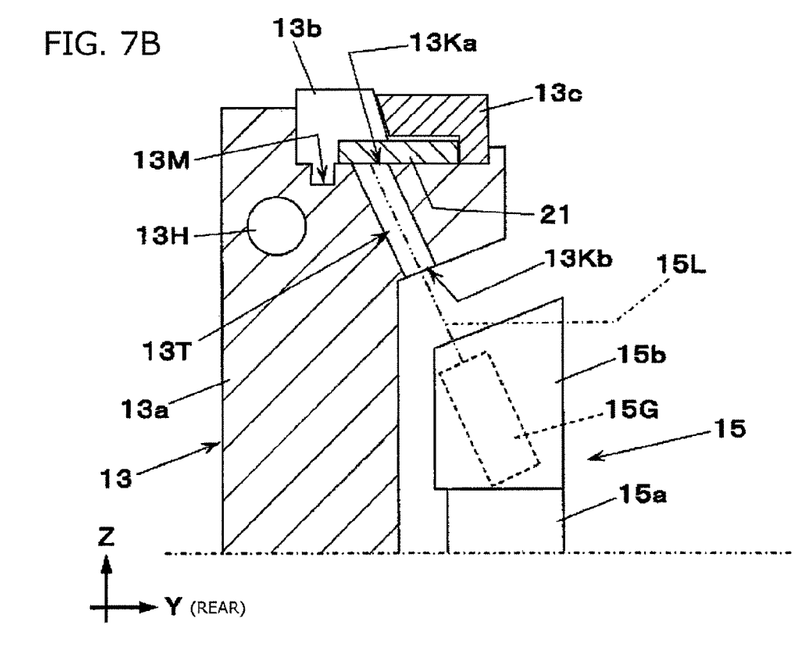

The light source 15G includes, for example, plural LED lamps (not shown) juxtaposed in the X-axis direction, and emits the light 15L with uniform intensity from the whole region in the X-axis direction toward the front upper side as a whole. In FIGS. 7A and 7B, the light 15L emitted to the front upper side by the light source 15G enters the optical path 13T from the lower opening 13Kb formed in the supporting part 13. Since the portions in which the four transparent members 13b are not installed in the upper opening 13Ka of the optical path 13T are covered with the light shielding member 21 as described above, the light reaching the transparent member 13b in the light 15L entering the optical path 13T is transmitted as it is, and reaches the adhesive member 4 (FIG. 7A), and the light reaching the light shielding member 21 is blocked by the light shielding member 21 (FIG. 7B). That is, the light shielding member 21 has a function of blocking the light 15L which attempts to reach a lower surface of the substrate 2 without passing through the transparent member 13b in the light 15L applied by the light irradiating part 15.

Figure 8:
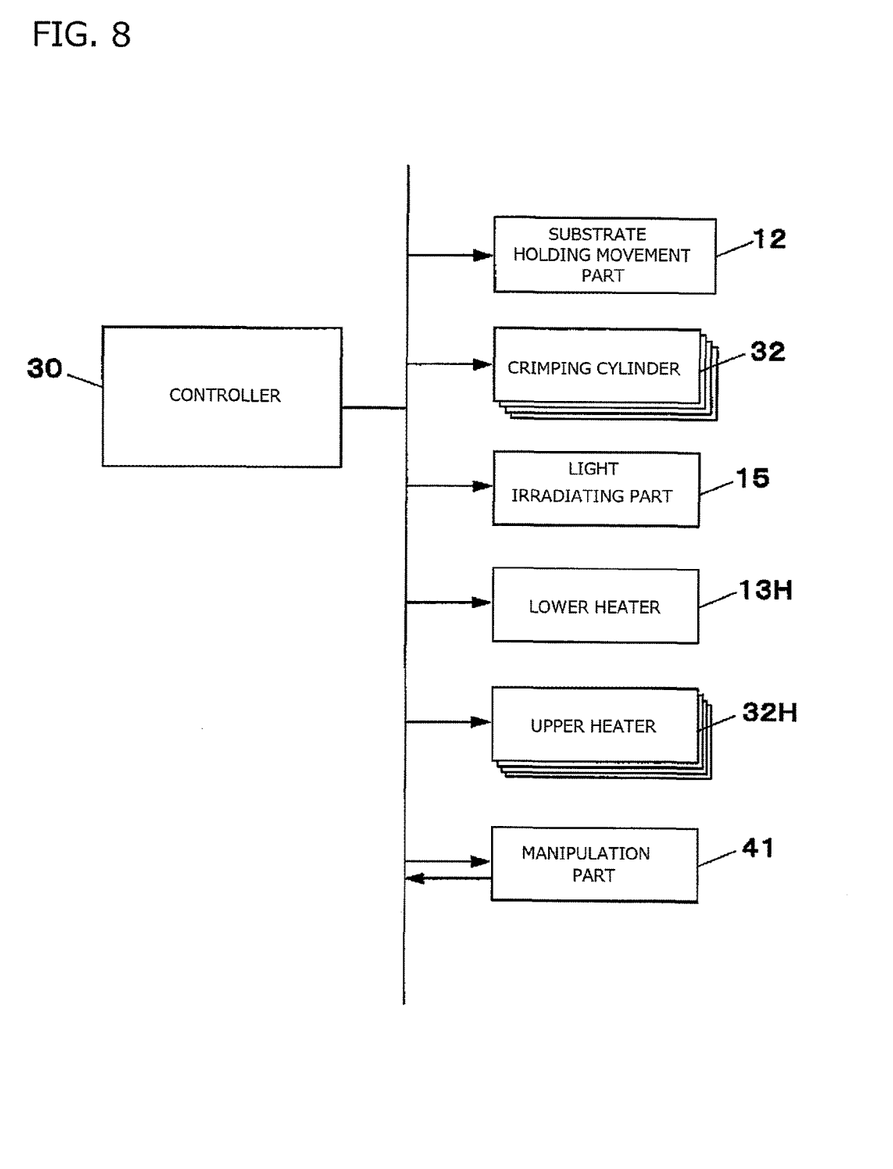
FIG. 8 is a block diagram showing a control system of the component crimping apparatus in the embodiment of the invention.

In FIG. 8, a controller 30 included by the component crimping apparatus 1 performs actuation control of the substrate holding movement part 12. Also, the controller 30 performs actuation control of each of the crimping cylinders 32, actuation control of the light irradiating part 15, the lower heater 13H and the upper heater 32H included by each of the crimping cylinders 32.

Next, work (component crimping work) of crimping the components 3 to the substrate 2 by the component crimping apparatus 1 will be described. Here, a procedure for crimping the eight components 3 attached to the edge 2F of the long side of the substrate 2 to the substrate 2 and then crimping the four components 3 attached to the edge 2F of the short side of the substrate 2 to the substrate 2 is shown.

All the eight components 3 attached to the edge 2F of the long side of the substrate 2 cannot be crimped in one collective crimping operation by the four crimping tools 32T. As a result, the eight components 3 are divided into two portions, and the four alternate components 3 (first crimping target) are first crimped and then, the other four components 3 (next crimping target) are crimped.

First, the operator OP makes preparation to crimp the components 3 of the first crimping target. In this preparation, the light shielding member 21 capable of arranging the transparent members 13b at a pitch corresponding to an interval (two times the arrangement pitch of the components 3) of the four alternate components 3 is first selected, and this light shielding member 21 is attached to the supporting part 13. At this time, each of the transparent members 13b is slid in the X-axis direction to position each of the transparent members 13b.

Next, the operator OP positions the crimping cylinders 32 so that the arrangement pitch of the four crimping tools 32T becomes equal to the arrangement pitch of the transparent members 13b and the four crimping tools 32T are located over the four transparent members 13b. After positioning of the transparent members 13b and the crimping tools 32T is completed, the operator OP performs a predetermined input manipulation from a manipulation part 41 (FIG. 8) connected to the controller 30. The controller 30 receiving this input manipulation actuates the lower heater 13H and the upper heater 32H of each of the crimping tools 32T, and respectively increases temperatures of each of the transparent members 13b of the supporting part 13 and each of the crimping tools 32T to predetermined temperatures.

Figure 9A:
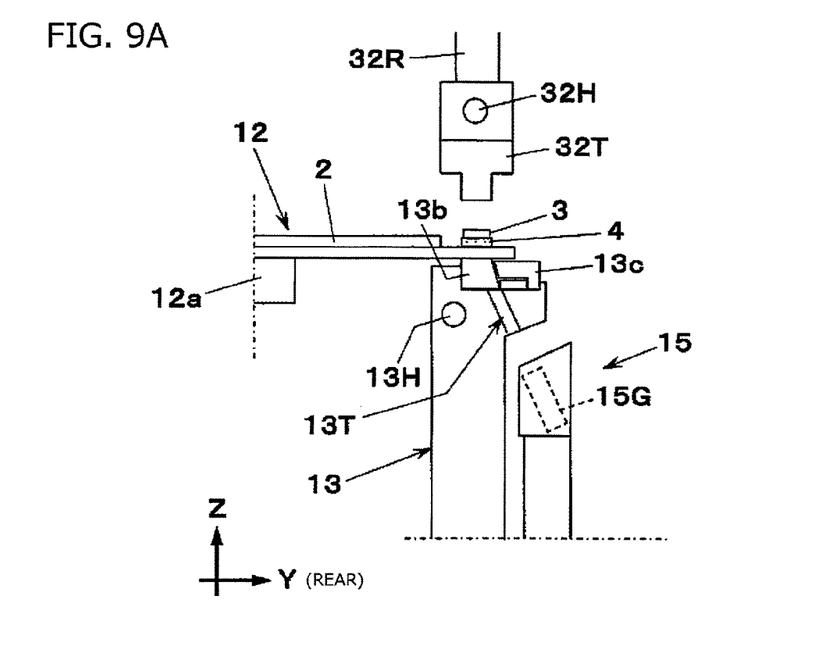
FIGS. 9A and 9B are operation explanatory diagrams of the component crimping apparatus in the embodiment of the invention.
Figure 10A:
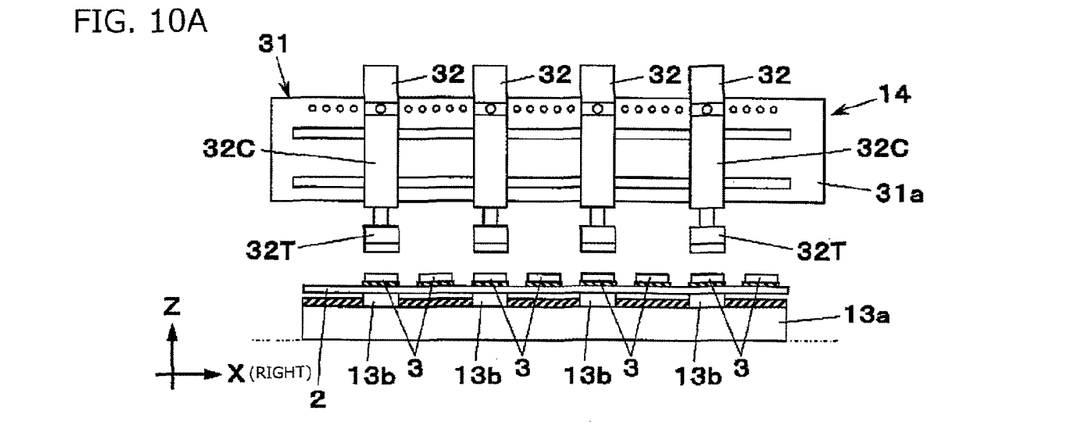
FIGS. 10A to 10C are operation explanatory diagrams of the component crimping apparatus in the embodiment of the invention.

After the temperatures of each of the transparent members 13b and each of the crimping tools 32T are respectively increased to the predetermined temperatures, a substrate conveyance apparatus (not shown) carries in the substrate 2, and the substrate holding part 12a receives and holds the substrate 2. Then, the holding part movement mechanism 12b of the substrate holding movement part 12 moves the substrate holding part 12a, and lower regions of the four electrodes 2d to which the four components 3 of the first crimping target are attached in a region of a lower surface of the substrate 2 are supported by the four transparent members 13b (FIG. 9A), and lower regions of the four electrodes 2d to which the four other components 3 (of the next crimping target) are attached are positioned in positions deviating from the upper sides of the four transparent members 13b (FIG. 10A). Accordingly, in the supporting part 13, the lower regions of the plural electrodes 2d (that is, targeted electrodes) targeted for crimping the components 3 in the region of the lower surface of the substrate 2 held by the substrate holding part 12a become supported by the transparent members 13b.

After the lower regions of the four electrodes 2d to which the four components 3 of the first crimping target are attached in the region of the lower surface of the substrate 2 are supported by the four transparent members 13b as described above, the four crimping cylinders 32 downwardly move the crimping tools 32T collectively. Accordingly, the four crimping tools 32T press the four components 3 of the crimping target to the substrate 2 (arrows C1 shown in FIGS. 9B and 10B). The crimping tools 32T press the components 3 to the substrate 2 held by the supporting part 13 in a heating environment in this manner and thereby, the components 3 are bonded to the substrate 2 (electrodes 2d) by the bonding force of the adhesive members 4.

Figure 9B:
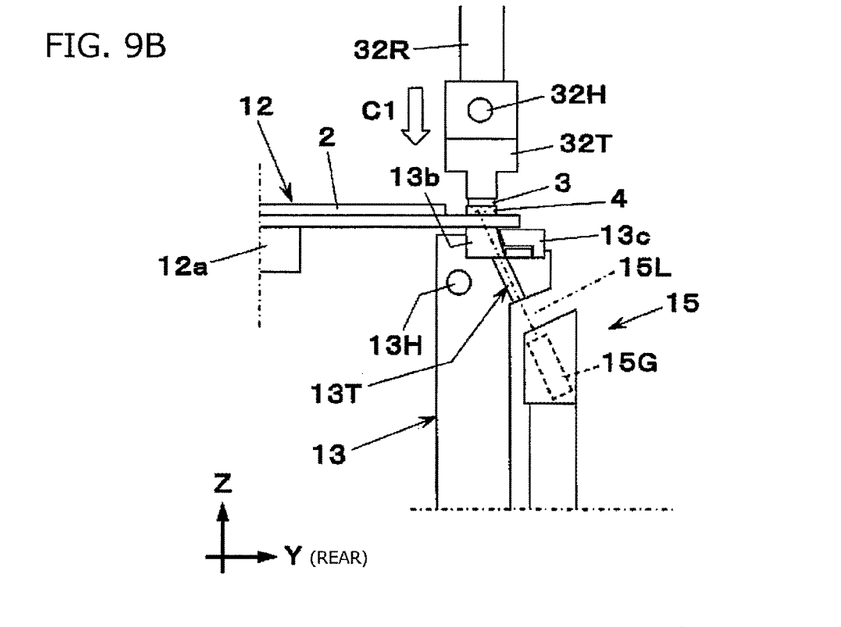
Figure 10B:
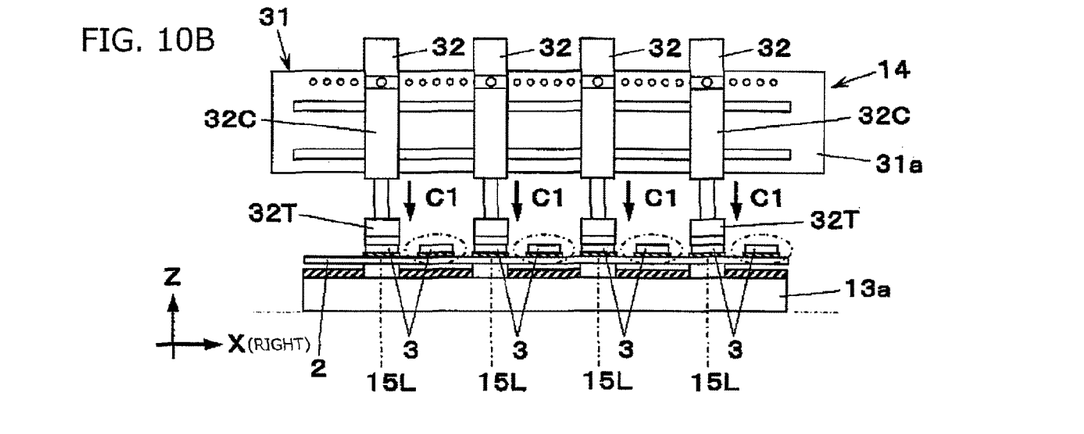

When the crimping tools 32T press the components 3 on the substrate 2 as described above, the light irradiating part 15 irradiates the inside of the optical path 13T with the light 15L from the lower opening 13Kb and thereby, the adhesive members 4 (each of the adhesive members 4 attached to the four electrodes 2d targeted for crimping) are irradiated with the light 15L from the lower surface side of the substrate 2 through the four transparent members 13b connected to the optical path 13T (FIGS. 9B and 10B). When the light 15L incident on the optical path 13T reaches the adhesive members 4, the adhesive members 4 are photocured.

Accordingly, the four components 3 of the first crimping target are crimped (permanently crimped) to the corresponding electrodes 2d, but while the light irradiating part 15 applies the light 15L, the light 15L does not reach the adhesive members 4 for temporarily fixing the four components 3 (components 3 surrounded by ellipses of chain lines in FIG. 10B) of the next crimping target (FIG. 10B) and the adhesive members 4 are not photocured. Thus, in the component crimping apparatus 1 in the embodiment, the light shielding member 21 formed on the base part 13a of the supporting part 13 blocks the light 15L which attempts to reach the lower surface of the substrate 2 without passing through the transparent member 13b in the light 15L incident on the optical path 13T, with the result that the adhesive members 4 stuck on the electrodes 2d are prevented from being photocured before the components 3 are crimped.

Figure 10C:
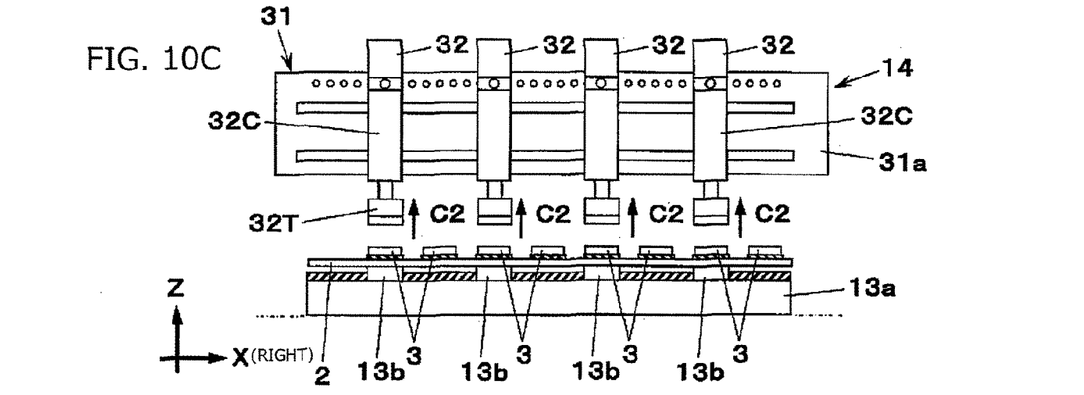
Figure 11A:
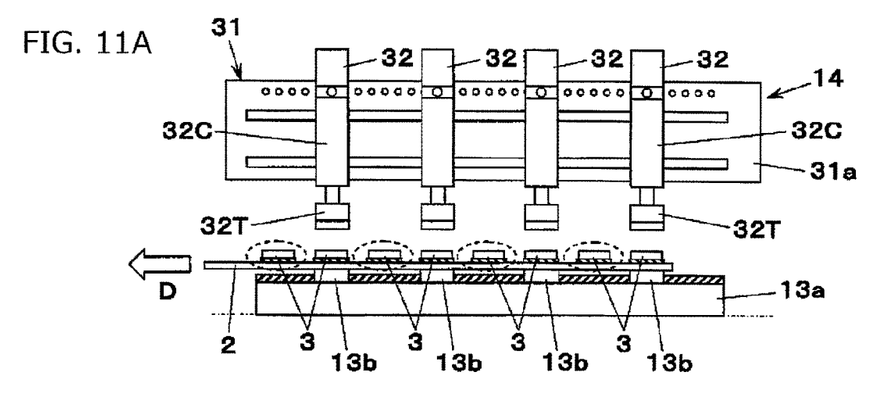
FIGS. 11A to 11C are operation explanatory diagrams of the component crimping apparatus in the embodiment of the invention.

After the four components 3 of the first crimping target are crimped to the electrodes 2d, the four crimping cylinders 32 upwardly move the crimping tools 32T (arrows C2 shown in FIG. 10C). Then, the holding part movement mechanism 12b moves the substrate holding part 12a (that is, the substrate 2) by the arrangement pitch of the components 3 in the X-axis direction (an arrow D shown in FIG. 11A). Accordingly, the four components 3 (components 3 surrounded by ellipses of broken lines in FIG. 11A) of the first crimping target already crimped to the electrodes 2d are positioned in positions deviating from the upper sides of the four transparent members 13b and in turn, the four components 3 of the next crimping target are positioned over the four transparent members 13b (FIG. 11A).

Figure 11B:
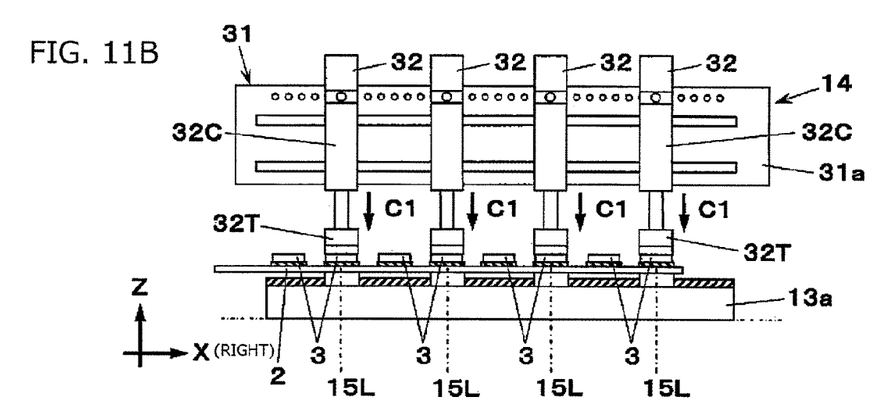

After lower regions of the four electrodes 2d (that is, targeted electrodes) to which the four components 3 of the next crimping target are attached in the region of the lower surface of the substrate 2 are supported by the four transparent members 13b as described above, the four crimping cylinders 32 are actuated and downwardly move the crimping tools 32T collectively, and press the four components 3 of the crimping target on the substrate 2 (arrows C1 shown in FIGS. 9B and 11B). Also, at this time, the light irradiating part 15 applies the light 15L (FIGS. 9B and 11B). Accordingly, the four components 3 of the next crimping target are crimped (permanently crimped) to the corresponding electrodes 2d.

Figure 11C:
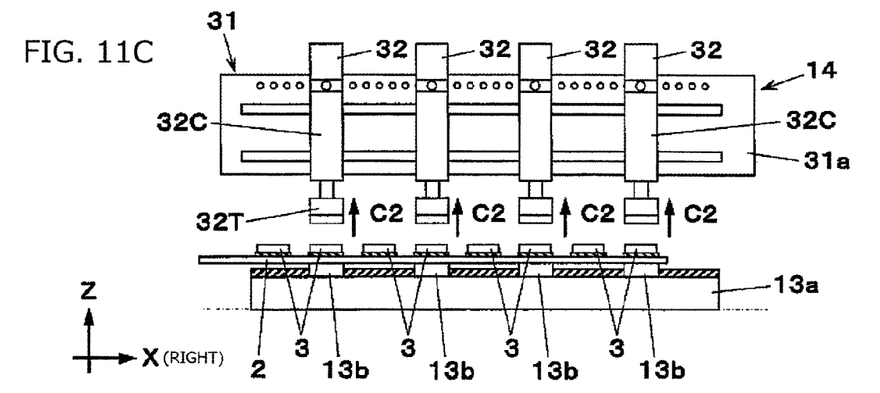

After the four components 3 of the next crimping target are crimped to the electrodes 2d, the four crimping cylinders 32 upwardly move the crimping tools 32T (arrows C2 shown in FIG. 11C). Then, the substrate holding movement part 12 retracts the edge 2F of the long side of the substrate 2 from the upper side of the supporting part 13. After the edge 2F of the substrate 2 is retracted, the operator OP then makes preparation to crimp the four components 3 attached to the edge 2F of the short side of the substrate 2 to the electrodes 2d of the substrate 2. In this preparation, the light shielding member 21 capable of arranging the transparent members 13b at a pitch corresponding to a distance of the four components 3 attached to the edge 2F of the short side of the substrate 2 is first selected, and this light shielding member 21 is attached to the supporting part 13. After an arrangement pitch of the transparent members 13b and an arrangement pitch of the crimping tools 32T are adjusted by this light shielding member 21, the operator OP performs a predetermined input manipulation from the manipulation part 41. Accordingly, the substrate holding movement part 12 performs operation of rotating the substrate 2 by 90°, and the crimping cylinders 32 crimp the components 3 to the edge 2F of the short side of the substrate 2 by operation similar to the case of crimping the components 3 to the edge 2F of the long side of the substrate 2.

Since the number of components 3 is the same (four) as the number of crimping tools 32T in crimping the components 3 attached to the edge 2F of the short side of the substrate 2, collective operation of the four crimping tools 32T is performed only one time. Thus, when the four components 3 is crimped to the edge 2F of the short side of the substrate 2, the substrate holding movement part 12 retracts the edge 2F of the short side of the substrate 2 from the upper side of the supporting part 13. After the edge 2F of the substrate 2 is refracted, the substrate conveyance apparatus (not shown) receives the substrate 2 from the substrate holding part 12a, and carries out the substrate 2 to the outside of the component crimping apparatus 1.

In the component crimping apparatus 1 in the embodiment as described above, the supporting part 13 is provided with the light shielding member 21 for covering the portion in which the transparent members 13b are not installed in the opening part (upper opening 13Ka) of the optical path 13T in the upper surface 13J of the base part 13a, and this light shielding member 21 blocks the light 15L which attempts to reach the lower surface of the substrate 2 without passing through the transparent member 13b in the light 15L incident on the optical path 13T. As a result, crimping failure can be prevented from occurring due to previous photocuring of the adhesive member 4 through which a component is not targeted for crimping.

A component crimping apparatus capable of preventing crimping failure from occurring due to previous photocuring of an adhesive member through which a component is not targeted for crimping is provided.

What is claimed is:

1. A component crimping apparatus comprising:
a substrate holding part that holds a substrate of a transparent material, a component previously attached to each electrode of a plurality of electrodes juxtaposed in an edge of the substrate through a photo-curable adhesive member;
at least one supporting part that has a base part provided with an optical path opened in an upper surface, and a transparent member installed on the upper surface of the base part and connected to the optical path, and supports, by the transparent member, a region under a targeted electrode in a lower surface of the substrate held by the substrate holding part, the targeted electrode being an electrode targeted for crimping the component among the plurality of electrodes;
at least one crimping tool that is arranged over the transparent member and presses the component to the substrate whose lower surface is supported by the supporting part;
a light irradiating part that irradiates the adhesive member attached to the targeted electrode with light from a lower surface side of the substrate through the transparent member by irradiating the optical path with the light when the crimping tool presses the component to the substrate; and a light shielding member that covers a portion in which the transparent member is not installed in an opening part of the optical path in the upper surface of the base part.

2. The component crimping apparatus according to claim 1, wherein the transparent member is configured slidably in a horizontal direction with respect to the upper surface of the base part.

3. The component crimping apparatus according to claim 1, wherein a plurality of the transparent members and the crimping tools are respectively juxtaposed in a direction of arrangement of the electrodes when the substrate is supported by the supporting part.

\* \* \* \* \*